(12) United States Patent
Kang (10) Patent No.: US 10,470,303 B2
(45) Date of Patent: Nov. 5, 2019

(54) RIGID-FLEX CIRCUIT INCLUDING COVERLAY

(71) Applicant: Samsung Electronics Co., Ltd., Suwon-si, Gyeonggi-do (KR)

(72) Inventor: Du-I Kang, Uijeongbu-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/661,597

(22) Filed: Jul. 27, 2017

(65) Prior Publication Data

US 2018/0063941 A1 Mar. 1, 2018

(30) Foreign Application Priority Data

Aug. 29, 2016 (KR) .......................... 10-2016-0110257

(51) Int. Cl.
*H05K 1/02* (2006.01)
*H05K 1/18* (2006.01)
*H05K 3/46* (2006.01)

(52) U.S. Cl.
CPC .......... *H05K 1/028* (2013.01); *H05K 1/0216* (2013.01); *H05K 1/0278* (2013.01); *H05K 3/4691* (2013.01); *H05K 2201/0195* (2013.01)

(58) Field of Classification Search
CPC .... H05K 1/028; H05K 1/0216; H05K 3/4691; H05K 2201/0195
See application file for complete search history.

(56) References Cited

U.S. PATENT DOCUMENTS

| 4,800,461 | A | * | 1/1989 | Dixon | H05K 3/4691 |
| | | | | | 156/253 |
| 5,262,594 | A | * | 11/1993 | Edwin | H05K 3/3452 |
| | | | | | 174/254 |
| 7,642,466 | B2 | * | 1/2010 | Nikaido | H05K 1/148 |
| | | | | | 174/250 |
| 2002/0140076 | A1 | * | 10/2002 | Yamazaki | H01L 21/4857 |
| | | | | | 257/686 |

(Continued)

FOREIGN PATENT DOCUMENTS

| KR | 10-2010-0127253 A | 12/2010 |
| KR | 10-1520233 B1 | 5/2015 |
| KR | 10-1550005 B1 | 9/2015 |

*Primary Examiner* — Ishwarbhai B Patel
(74) *Attorney, Agent, or Firm* — Jefferson IP Law, LLP (57) ABSTRACT

A multilayer rigid-flex circuit board is provided. The multilayer rigid-flex circuit board includes at least one rigid circuit section, at least one flex circuit section disposed to face the rigid circuit section, and circuit layers disposed to be extended and formed in equal layers within the rigid circuit section and the flex circuit section. The flex circuit section may include a coverlay disposed to face a dielectric layer of the rigid circuit section and formed above or below the circuit layer disposed within the flex circuit section. The coverlay may include a coverlay film, and a first cover resin layer and a second cover resin layer respectively laminated on opposite surfaces of the coverlay films. Since high-speed wiring and interlayer separation, which may occur in a multilayer structure, are eliminated, it is possible to reduce noise and to achieve signal integrity and stabilization of radio frequency interference (RFI).

15 Claims, 5 Drawing Sheets

(56) References Cited

U.S. PATENT DOCUMENTS

| | | | |
|---|---|---|---|
| 2008/0093118 A1* | 4/2008 | Takahashi | H05K 3/4691 |
| | | | 174/264 |
| 2011/0005811 A1 | 1/2011 | Yamato | |
| 2011/0033682 A1 | 2/2011 | Shimizu et al. | |
| 2012/0222889 A1* | 9/2012 | Davis | C08G 18/345 |
| | | | 174/254 |
| 2015/0114690 A1* | 4/2015 | Ishihara | H05K 3/4691 |
| | | | 174/251 |
| 2016/0095207 A1* | 3/2016 | Taniguchi | H05K 3/4691 |
| | | | 174/252 |

* cited by examiner

RIGID-FLEX CIRCUIT INCLUDING COVERLAY

CROSS-REFERENCE TO RELATED APPLICATION(S)

This application claims the benefit under 35 U.S.C. § 119(a) of a Korean patent application filed on Aug. 29, 2016 in the Korean Intellectual Property Office and assigned Serial number 10-2016-0110257, the entire disclosure of which is hereby incorporated by reference.

TECHNICAL FIELD

The present disclosure relates to a multilayer rigid-flex printed circuit board including a coverlay.

BACKGROUND

Recently, as miniaturization, slimming, and high density of electronic devices have been emphasized, high integration and thinning of printed circuit boards included in electronic devices have been demanded. Printed circuit boards may be classified into a rigid printed circuit board, a flexible printed circuit board, a rigid-flex printed circuit board in which a rigid printed circuit board and a flexible printed circuit board are combined, and so on, based on the physical properties thereof.

Among them, the demand for flexible printed circuit boards (also referred to as "flexible printed circuits (FPCs)") and rigid-flex printed circuit boards is increasing, and the printed circuit boards have a structure in which a circuit made of a metal layer is formed on an insulative film, such as a polyimide (PI) film.

As the high integration of circuits is required, a rigid-flex printed circuit board has a multilayer structure in which a double-sided printed circuit board and a single-sided printed circuit board are coupled to each other. That is, a multilayer rigid-flex printed circuit board may have a structure in which single-sided printed circuit boards, each of which includes a circuit layer and an insulating layer, are respectively bonded to the top and bottom sides of a double-sided printed circuit board, which includes a circuit layer and an insulating layer, via bonding sheets therebetween.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a multilayer rigid-flex printed circuit board including a coverlay. Although the high integration of circuits has been achieved by means of a multilayer rigid-flex printed circuit board as described above, there is a limitation to the extent to which the multilayer flexible printed circuit board can be thinned due to the use of bonding sheets to bond the printed circuit boards to each other.

In addition, when a rigid-flex printed circuit board is implemented only with a coverlay without using a bonding sheet as described above, there is a problem in that an assembly failure, such as reverse bending, occurs in a specific layer due to non-adhesion between layers in the multilayer flex circuit board.

In accordance with an aspect of the present disclosure, a rigid-flex circuit board, in which strong bonding is provided. The rigid-flex circuit board includes multiple layers (specific layers or all layers) only in a flex circuit section, except for a rigid section, without a bonding sheet circuit board, thereby providing a slim printed circuit board.

Further, the present disclosure provides a rigid-flex circuit board in which reverse bending or deflection does not occur in a specific layer, so that even when a high-speed wiring is provided in the circuit board, noise can be reduced and signal integrity and stabilization of radio frequency interference (RFI) can be achieved.

In accordance with another aspect of the present disclosure, a multilayer rigid-flex circuit board is provided. The multilayer rigid-flex circuit board may include at least one rigid circuit section, at least one flex circuit section disposed to face the at least one rigid circuit section, and a plurality of circuit layer disposed to be extended and formed in equal layers within the at least one rigid circuit section and the at least one flex circuit section.

The at least one flex circuit section may include at least one coverlay disposed to face a dielectric layer of the at least one rigid circuit section and formed above or below the at least one circuit layer disposed within the at least one flex circuit section. The at least one coverlay may include a coverlay film, and a first cover resin layer and a second cover resin layer respectively laminated on opposite surfaces of the coverlay film.

In accordance with another aspect of the present disclosure, a multilayer rigid-flex circuit board is provided. The multilayer rigid-flex circuit board may include at least one rigid circuit section including external circuit layers and internal circuit layers disposed between the one or more external circuit layers, and at least one flex circuit section disposed to face the at least one rigid circuit section. The at least one flex circuit section may include at least one coverlay that protects at least one surface of the one or more external circuit layers or the internal circuit layers, and the at least one coverlay may include a coverlay film, and a cover resin layer laminated on at least one surface of the coverlay film.

In accordance with another aspect of the present disclosure, a multilayer rigid-flex circuit board is provided. The multilayer rigid-flex circuit board may include a plurality of circuit layers including a rigid circuit section and a flex circuit section, at least one dielectric layer disposed between adjacent circuit layers among the plurality of circuit layers in the rigid circuit section, and a coverlay disposed to face the at least one dielectric layer between the adjacent circuit layers in the flex circuit section. The coverlay may include at least one coverlay film, and a first cover resin layer and a second cover resin layer respectively laminated on opposite surfaces of the at least one coverlay film.

In the multilayer rigid-flex printed circuit board according to the present disclosure, a circuit layer is protected using dielectrics that are different from each other between a rigid circuit section and a flex circuit section. Therefore, it is possible to eliminate a side effect of reverse bending or deflection, which may be caused in a specific layer when interlayer adhesion is not made.

In addition, in the multilayer rigid-flex printed circuit board according to the present disclosure, a bonding sheet, which has been used in the past, is obviated. Thus, it is possible to implement a printed circuit board that has a reduced thickness and enables a reduction in the number of assembly options thereof.

In the multilayer rigid-flex printed circuit board according to the present disclosure, high-speed wiring, which has been recently applied, and interlayer separation, which may occur in a multilayer structure, are eliminated. Thus, it is possible to reduce noise and to achieve signal integrity and stabilization of radio frequency interference (RFI).

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, various embodiments of the present disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. The expression "a first", "a second", "the first", or "the second" used in various embodiments of the present disclosure may modify various components regardless of the order and/or the importance but does not limit the corresponding components. When an element (e.g., first element) is referred to as being "(functionally or communicatively) connected," or "directly coupled" to another element (second element), the element may be connected directly to another element or connected to another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the present disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a Moving Picture Experts Group (MPEG-1 or MPEG-2) Audio Layer-3 (MP3) player, a mobile medical device, a camera, and a wearable device. According to various embodiments, the wearable device may include at least one of an accessory type (e.g., a watch, a ring, a bracelet, an anklet, a necklace, glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a digital versatile disk (DVD) player, an audio, a refrigerator, an air conditioner, a vacuum cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices (VID), an electronic devices for a ship (e.g., a navigation device for a ship, and a gyro-compass), avionics, security devices, an automotive head unit, a robot for home or industry, an automatic teller's machine (ATM) in banks, point of sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to an embodiment of the present disclosure is not limited to the above described devices. In the present disclosure, the term "user" may indicate a person using an electronic device or a device (e.g., an artificial intelligence electronic device) using an electronic device.

Figure 1:
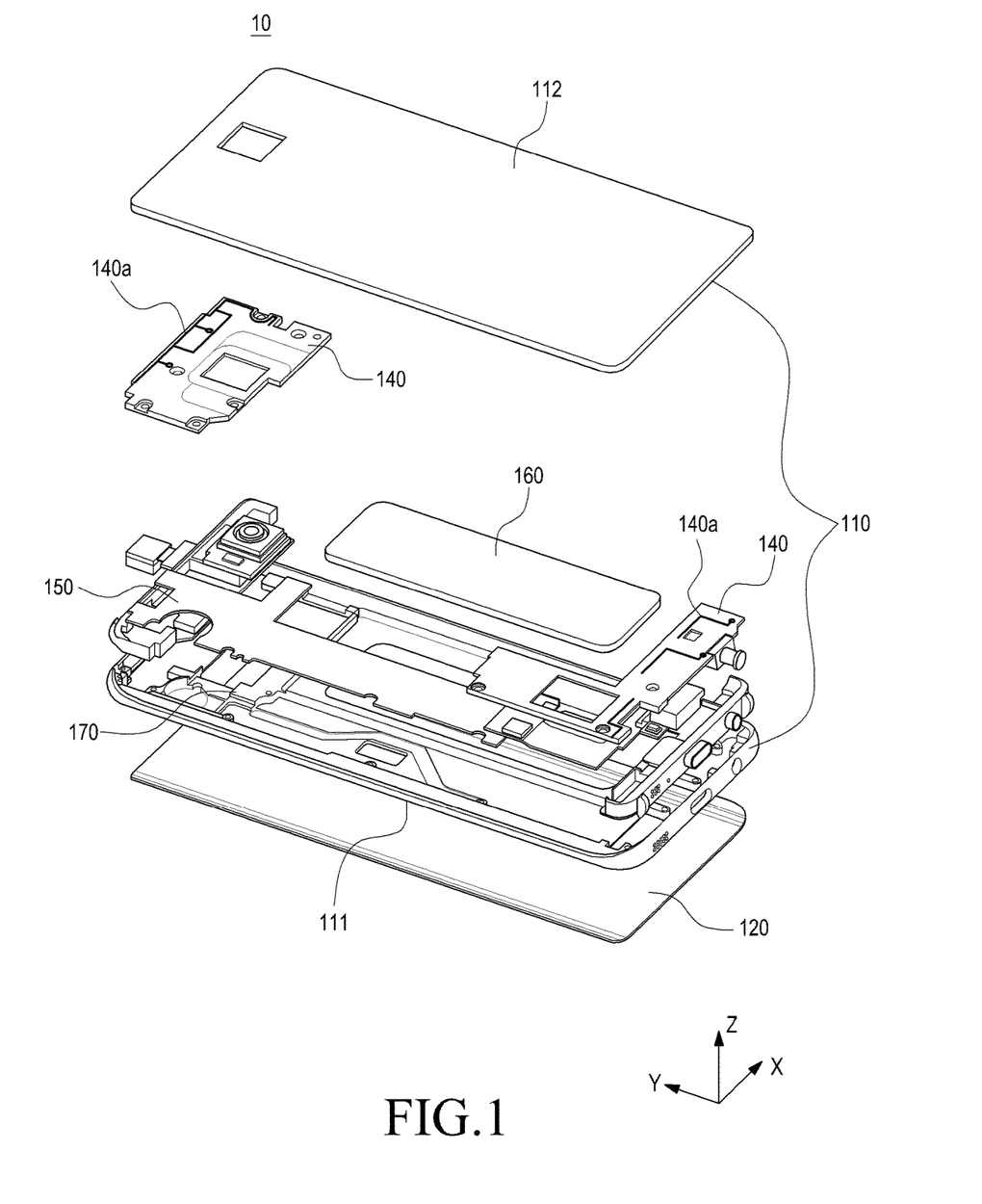
FIG. 1 is an exploded perspective view plan view illustrating an electronic device according to an embodiment of the present disclosure in a partially disassembled state.

FIG. 1 is an exploded perspective view plan view illustrating an electronic device 10 according to an embodiment of the present disclosure in a partially disassembled state.

Referring to FIG. 1, an "X-axis" in an orthogonal coordinate system of three axes may correspond to the width direction of the electronic device 10, a "Y-axis" may correspond to the length direction of the electronic device 10, and a "Z-axis" may correspond to the thickness direction of the electronic device 10. In one embodiment of the present disclosure, the "X-axis direction" may be referred to as a first direction (+X, −X), the "Y-axis direction" may be referred to as a second direction (+Y, −Y), and the "Z-axis direction" may be referred to as a third direction (+Z, −Z).

Referring to FIG. 1, the electronic device 10 may include a housing 110, a display device 120, and a printed circuit board 150.

According to various embodiments, the housing 110 is for accommodating various electronic components and the like, and at least a portion of the housing 110 may be made of a conductive material. For example, the housing 110 may include sidewalls forming the outer surface of the electronic device 10. Alternatively, a portion of the housing 110, which is exposed to form the exterior of the electronic device 10, may include a conductive material. Within the housing 110, the printed circuit board 150 and/or a battery 160 may be accommodated. For example, a processor, a communication module, various interfaces, a power management module, a control circuit, or the like may be disposed on the printed circuit board 150. Alternatively, a processor, a communication module, various interfaces, a power management module, or a control circuit may be configured in the form of an integrated circuit chip to be mounted on the printed circuit board 150. For example, the control circuit may be a portion of the above-described processor or communication module.

According to various embodiments, the housing 110 may include a first surface 111, and a rear cover 112 disposed to be spaced apart from and face the first surface 111. The rear cover 112 protects the rear surface of the electronic device 10, and forms the external appearance of the electronic device 10 together with the display device 120.

According to various embodiments, the display device 120 may be at least partially made of a material that transmits radio waves or magnetic fields. For example, the display device 120 may include a window member made of a tempered glass material and a display panel mounted on the inner surface of the window member. A touch panel may be mounted between the window member and the display device. For example, the display device 120 may be an output device for outputting a screen, and may be used as an input device equipped with a touchscreen function.

According to various embodiments, a support unit 170 (e.g., a support device) may be mounted to extend within the housing 110. The support unit 170 may be made of a metallic material, and may be disposed within a space that is defined by the display device 120 and the rear cover 112. For example, the support unit 170 may be interposed between the display device 120 and the printed circuit board 150. The support unit 170 may prevent the integrated circuit chips mounted on the printed circuit board 150 from coming into contact with the display device 120, and may provide an electromagnetic shielding function, thereby preventing electromagnetic interference between the integrated circuit chips. The support unit 170 may compensate for the rigidity of the electronic device 10. For example, the housing 110 may be formed with a plurality of openings or recesses depending on the arrangement of the electronic components inside the electronic device 10, which may reduce the rigidity of the housing 110 or the electronic device 10. The support unit 170 may be mounted within and attached to the housing 110 so as to improve the rigidity of the housing 110 or the electronic device 10.

Although not illustrated in detail in the drawings, according to various embodiments, various structures may be formed on the surfaces of the housing 110 and the support unit 170 according to the arrangement of the electronic components disposed inside the electronic device 10 or the attachment structures between the housing 110 and the support unit 170. For example, a space may be formed in each of the housing 110 and the support unit 170 to accommodate integrated circuit chips mounted on the printed circuit board 150. The space for accommodating integrated circuit chips may be formed in the form of a recess or may be formed by a rib or the like that surrounds the integrated circuit chips. According to various embodiments, corresponding fastening bosses and fastening holes may be formed in the housing 110 and the support unit 170. For example, when fastening members, such as screws, are fastened to the fastening bosses or the fastening holes, the housing 110 and the support unit 170 may be attached to each other in the state in which the housing 110 and the support unit 170 face each other, or in the state in which the support unit 170 is accommodated in the housing 110.

According to various embodiments, the electronic device 10 may include two or more radiating conductors that are disposed to face the printed circuit board 150 and constitute an antenna. For example, at least one of the two or more radiation conductors may be a conductor or radiator of at least a portion of the housing 110. As another example, at least one of the two or more radiation conductors may be a radiator 140a patterned on a structure 140 that includes the radiators. The antenna may transmit or receive radio waves therethrough, or may generate a magnetic field.

According to various embodiments, at least one of terminal circuits, for example, an application processor (AP), a communication processor (CP), a memory, and an RF transceiver, may be mounted on the printed circuit board 150, which may include a signal line (e.g., an RF signal line).

According to an embodiment of the present disclosure, the printed circuit board 150 is formed of a plurality of layers, and the plurality of layers may include one or more conductive layers and one or more insulating layers. The printed circuit board 150 according to an embodiment of the present disclosure will be described in further detail with reference to FIGS. 2, 3, 4A, 4B, 5A, and 5B.

Figure 2:
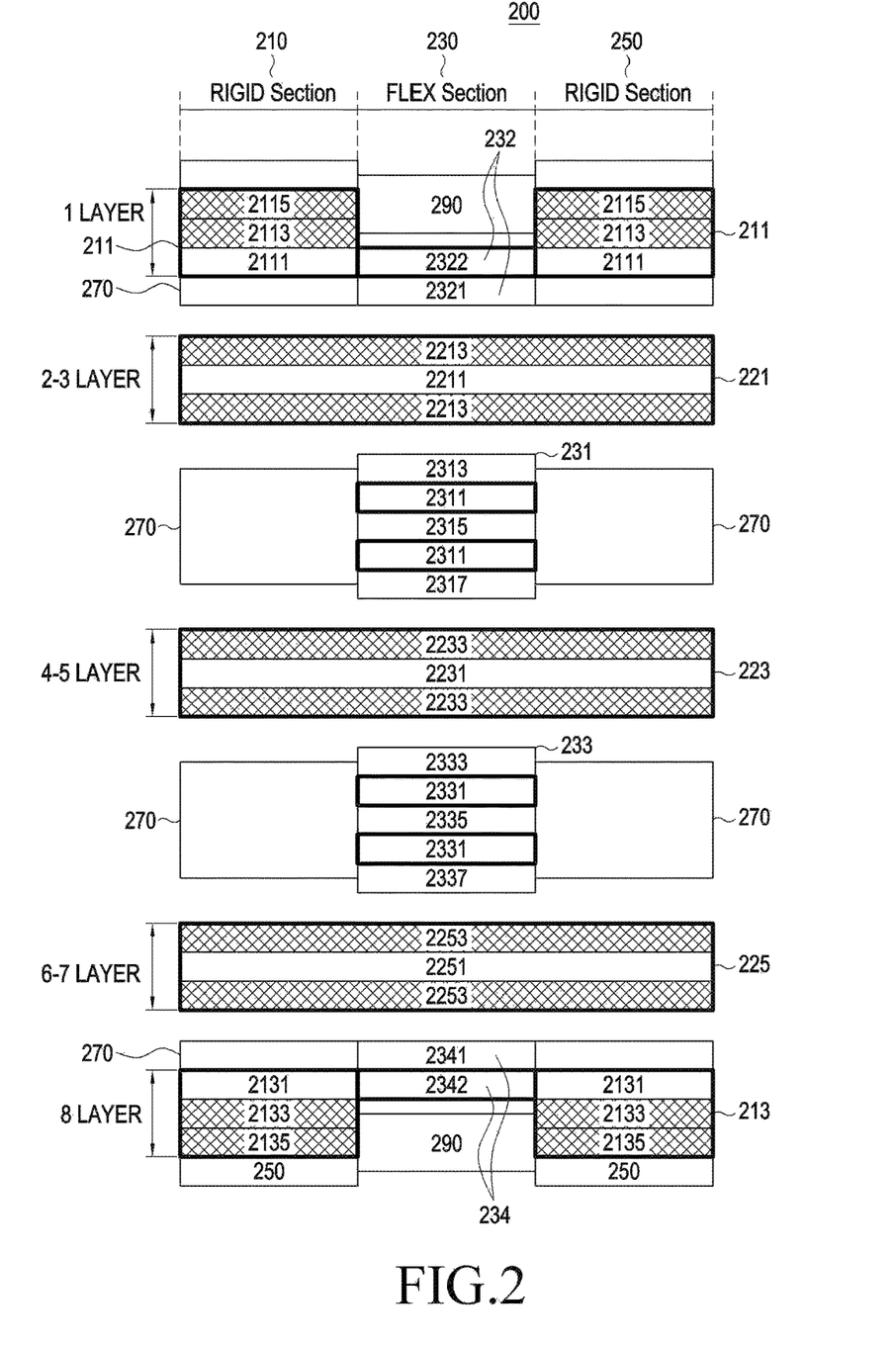
FIG. 2 is a sectional view illustrating a configuration in each layer in a rigid-flex circuit board within an electronic device according to an embodiment of the present disclosure.

FIG. 2 is a sectional view illustrating a configuration in each layer in a rigid-flex circuit board 200 within an electronic device 10 according to an embodiment of the present disclosure.

According to various embodiments, the rigid-flex circuit board 200 illustrated in FIG. 2 may be the printed circuit board 150 of FIG. 1.

Referring to FIG. 2, the rigid-flex circuit board 200 according to the present disclosure will described based on a type that is configured as an 8-layer rigid circuit board, a 6-layer flex circuit board, and an 8-layer rigid circuit board.

According to various embodiments, the rigid-flex circuit board 200 may be configured as a multilayer structure, and may include rigid circuit sections 210 and 250 and a flex circuit section 230 disposed to face at least a portion of the rigid circuit sections 210 and 250. The rigid circuit sections 210 and 250 and the flex circuit section 230 may share at least one external circuit layer 211 and/or at least one internal circuit layer 221.

According to various embodiments, a flex circuit section 230 may be disposed between the rigid circuit sections 210 and 250. For example, the rigid circuit sections 210 and 250 may include a first rigid circuit section 210 and a second rigid circuit section 250, and the flex circuit section 230 may be disposed between the first rigid circuit section 210 and the second rigid circuit section 250. The first rigid circuit section 210 and the second rigid circuit section 250 may form the same layers and structures. Hereinafter, the first rigid circuit section 210 will be described, and the descriptions of the first rigid section 210 will also be applicable to the second rigid circuit section 250. However, the present disclosure is not limited to the above-described structures, and the rigid-flex circuit board 200 may be formed in various arrangements and layers. For example, the rigid circuit section may be disposed between a plurality of flex circuit sections.

According to various embodiments, the rigid-flex circuit board 200 may include one or more internal circuit layers 221, 223, and 225, and one or more external circuit layers 211 and 213. For example, the rigid-flex circuit board 200 may include a first internal circuit layer 221, a second internal circuit layer 223, and a third internal circuit layer 225 disposed between the external circuit layers 211 and 213. Hereinafter, the first internal circuit layer 221 will be described, and the descriptions of the first internal circuit layer 221 will also be applicable to the second internal circuit layer 223 and the third internal circuit layer 225.

According to various embodiments, the one internal circuit layer 221 may be a portion that is formed over the entire rigid circuit section 210 and the entire flex circuit section 230, and may form a core in the rigid-flex circuit board 200. For example, the internal circuit layer 221 may be a laminate plate in which a thin metal plate is laminated on at least one side of a polyimide (PI)-based substrate layer 2211, such as a flexible copper clad laminate (FCCL). According to an embodiment, the internal circuit layer 221 disposed in the second to seventh layers of the rigid circuit section 210 may be a laminate plate, in which a copper foil 2213 is laminated on the entire upper surface and/or the entire lower surface of the PI-based substrate layer 2211.

According to various embodiments, the internal circuit layer 221 may be formed by processing a copper foil 2213 disposed on the entire upper surface and/or the entire lower front surface of the substrate layer 2211 by a method such as exposure or etching. For example, the internal circuit layer 221 may be formed by a subtractive process, an additive process, a modified semi-additive process (MSAP), or the like, according to a manufacturing process.

According to various embodiments, the substrate layer 2211 serves as an insulator, and through holes (not illustrated), the inner walls of which are plated for electrical connection between the two surfaces of the substrate layer 2211, may be formed therein, thereby achieving internal electric conduction.

According to various embodiments, the rigid circuit section 210 is a portion other than the flex circuit section 230, and one or more external circuit layers 211 and 213 and a dielectric layer 270 are laminated on the internal circuit layer 221 to form a build-up layer, so that relative deformation can be restricted in the case of bending, compared with the flex circuit section 230. For example, the dielectric layer 270 may be a prepreg obtained by impregnating a glass fabric or a glass mat with a catalyst-added unsaturated polyester resin and gelatinizing the resin.

According to various embodiments, the flex circuit section 230 is a portion that is relatively flexible compared with the rigid circuit section 210, and can be relatively flexibly deformed in the event of bending. The internal circuit layer 221 disposed in the flex circuit section 230 may be covered with a layer including a separate coverlay.

According to various embodiments, the external circuit layers 211 and 213 may be disposed above and/or below the internal circuit layer 221. Hereinafter, the first external circuit layer 211 will be described, and the descriptions of the first external circuit layer 211 will also be applicable to the second external circuit layer 213.

According to various embodiments, the external circuit layer 211 may be a laminate plate in which a thin metal plate 2113 is laminated on at least one side of a PI-based substrate layer 2111, such as an FCCL.

According to various embodiments, the external circuit layer 211 may be formed on at least a portion of the rigid circuit section 210. For example, the external circuit layer 211 may be formed in multiple layers by repeating the processes of applying an adhesive material, and pressing a dielectric layer 270, such as a prepreg, and a copper foil 2113.

According to various embodiments, the external circuit layer 211 may be formed through an etching method using photolithography or an additive method (plating method). For example, the external circuit layer 211 may be connected to an external circuit layer and an internal circuit layer, which are formed in another layer, through a via (not illustrated) or the like that is formed through the dielectric layer 270. However, the external circuit layer 211 may be manufactured through a specific manufacturing method, and may be modified in various manners as needed.

According to various embodiments, an ink layer may be disposed on one side of the external circuit layer 211. For example, the ink layer may be coated on the upper surface of a plated copper foil circuit 2115 so as to protect the circuit and to prevent the occurrence of an inter-circuit solder bridge. As still another example, the ink layer may be formed of an insulating coating material, such as a solder resist, and when the solder resist is formed, for example, a photo-imageable solder resist (PSR) ink may be used. Even after a component is mounted, the ink may remain in the product so as to provide an insulating and protective action. Therefore, the ink layer is coated on the outside of the external circuit layer 211 to prevent short circuits, laminating, corrosion, and contamination of circuits, which occur during the manufacturing process, and to protect the external circuit layer 211 from external shock, moisture, and chemical substances even after the manufacture.

According to various embodiments, the ink layer is a layer formed on the rigid circuit section 210, instead of the second rigid circuit section 250, and may be continuously laminated over the entire layer.

TABLE 1

| LAYER | SPEC. | THICK (um) | ± | RIGID | FLEX |
|---|---|---|---|---|---|
| 1LAYER | EMI | 16 | | | 16 |
| | PSR | 30 | 5 | 30 | |
| | Cu plating | 18 | 4 | 18 | |
| | Copper | 12 | | 12 | |
| | Polyimide | 12 | | 12 | |
| | P/P | 40 | | 40 | |
| 2LAYER | C/L Film | 12.5 | | | 12.5 |
| 3LAYER | C/L Adhesive | 15 | | | 15 |
| | Copper | 12 | | 12 | 12 |
| | Polyimide | 12 | | 12 | 12 |
| | Copper | 12 | | 12 | 12 |
| | C/L Adhesive | 10 | | | 10 |
| | C/L Film | 12.5 | | | 12.5 |
| | C/L Adhesive | 10 | | | 10 |
| | P/P | 40 | | 40 | |
| 4LAYER | C/L | 12.5 | | | 12.5 |
| 5LAYER | C/L Adhesive | 15 | | | 10 |
| | Copper | 12 | | 12 | 12 |
| | Polyimide | 12 | | 12 | 12 |
| | Copper | 12 | | 12 | 12 |
| | C/L Adhesive | 15 | | | 10 |
| | C/L Film | 12.5 | | | 12.5 |
| | C/L Adhesive | 10 | | | 10 |
| | P/P | 40 | | 40 | |
| 6LAYER | C/L | 12.5 | | | 12.5 |
| 7LAYER | C/L Adhesive | 15 | | | 10 |
| | Copper | 12 | | 12 | 12 |
| | Polyimide | 12 | | 12 | 12 |
| | Copper | 12 | | 12 | 12 |
| | C/L Adhesive | 15 | | | 15 |
| | C/L Film | 12.5 | | | 12.5 |
| | P/P | 40 | | 40 | |
| 8LAYER | Polyimide | 12 | | | 12 |
| | Copper | 12 | | | 12 |
| | Cu plating | 18 | 4 | 18 | |
| | PSR | 30 | 5 | 30 | |
| | C/L Adhesive | 25 | | | |
| | C/L | 12.5 | | | |
| | EMI | 16 | | | 16 |
| | Total Thickness (um) | | | 412 | 305 |
| | LAYER | | | 8 | 6 |

LAYER: Number of Layers

Table 1 represents an 8-5-8 structure (a rigid circuit section of 8 layers and a flex circuit section of 5 layers) of a rigid-flex circuit board 200, and the specification of each layer is represented.

Referring to FIG. 2 and Table 1, according to an embodiment of the present disclosure, the flex circuit section 230 may include an internal circuit layer 221 and coverlays 231, 232, 233, and 234. Internal coverlays 231 and 233 may be disposed above and/or below the internal circuit layer 221.

As still another example, the external coverlays 232 and 234 may be disposed above and/or below the external circuit layer 211.

According to various embodiments, the internal coverlays 231 and 233 include a first internal coverlay 231 disposed below the second layer-third layer regions of the flex circuit section 230 and a second internal coverlay 233 disposed below the fourth layer-fifth layer regions of the flex circuit section 230. Hereinafter, the first internal coverlay 231 will be described, and the descriptions of the first internal coverlay 231 will be applicable to the second internal coverlay 233.

According to various embodiments, the internal coverlay 231 can be coupled with another internal circuit layer 221 without a bonding sheet, and can protect the internal circuit layers 221.

According to various embodiments, the internal coverlay 231 may include a coverlay film 2311, and a first cover resin layer 2313 and a second cover resin layer 2315, which are respectively laminated on both sides of the coverlay film 2311. The coverlay film 2311 may include a polyimide (PI) resin, which is formed between the first cover resin layer 2313 and the second cover resin layer 2315 and is configured as an electrically insulating layer. For example, the PI resin may be a high heat-resistant resin prepared by performing solution polymerization of an aromatic dianhydride with an aromatic diamine or an aromatic diisocyanate to prepare a polyamic acid derivative, and then causing ring-closing dehydration and imidization of the polyamic acid derivative at a high temperature. Therefore, such a PI resin is an insoluble and infusible ultra-high-heat-resistant resin and may be excellent in thermal oxidation resistance, heat resistance, radiation resistance, low-temperature characteristics, and chemical resistance.

According to various embodiments, the coverlay film 2311 may be manufactured to have a thickness of 5-30 um. In the specification of Table 1, the coverlay film 2311 is indicated as 12.5 um, but this is merely an example. The coverlay film 2311 may be variously manufactured in consideration of the coverlay to be manufactured without limitation.

According to various embodiments, a first cover resin layer 2313 is laminated on one side of the coverlay film 2311 in a dry state, and a second cover resin layer 2315 is laminated on the other side of the coverlay film 2311 in a dry state. For example, the first cover resin layer 2313, the coverlay film 2311, and the second resin cover layer 2315 are laminated sequentially from the top. At this time, the first cover resin layer 2313 and the second resin cover layer 2315 may be in a semi-cured state.

According to various embodiments, at least two coverlay films 2311 may be deposited within the internal coverlay 231, with the second cover resin layer 2315 being interposed therebetween. For example, the first coverlay film 2311 disposed on the upper side can protect the first internal circuit layer 221, and the second coverlay film 2311 disposed on the lower side can protect the second internal circuit layer 223.

According to various embodiments, the plurality of coverlay films 2311 inside the internal coverlay 231 may share mutually facing the second cover resin layers 2315.

According to various embodiments, in the rigid-flex circuit board 200, the internal circuit layer 221 may be shared, the dielectric layer 270 may be laminated in the rigid circuit section 210 on one side of the internal circuit layer 221, and the cover layer 231 may be laminated on the flex circuit section 230 on one side of the internal circuit layer 221. The dielectric layer 270 on the rigid circuit section 210 and the coverlay 231 on the flex circuit section 230 may be disposed to face each other, and may not be superimposed on each other by being laminated only on the respective sections thereof. For example, the first cover resin layer 2313 and/or the second cover resin layer 2315 laminated on the internal circuit layer 221 of the flex circuit section 230 are formed only in the flex circuit section 230, and are laminated so as not to interfere with the dielectric layer 270 disposed on the rigid circuit section 210.

As described above, the plurality of coverlay films 2311 inside the internal coverlay 231 may share mutually facing cover resin layers 2315. For example, the first cover resin layer 2313, the first coverlay film 2311, and the second cover resin layer 2315 may be formed on the bottom surface of the internal circuit layer 221 constituting the second and third layers, and the second cover resin layer 2315, the second coverlay film 2311, and the third cover resin layer 2317 may be on the top surface of the internal circuit layer 221 constituting the fourth and fifth layers. Therefore, the second cover resin layer 2315 may be bonded to protect the internal circuit layer 221 as well as to prevent multi-layers from being separated from each other.

In the case of a bonding tape attached to the circuit layer of the flex circuit section for maintaining the bonding in an existing multilayer substrate, the bonding tape could not exist only in the flex circuit section due to a difference in physical properties. For example, even if the bonding tape is deposited in the flex circuit section, the bonding tape exists in a state of being introduced into or superimposed on the rigid circuit section by the pressing according to the lamination. Thus, the bonding tape is formed as a single layer extending over the flex circuit section and the rigid circuit section. In this case, there is problem in that the overall thickness of the circuit board is increased.

In addition, in the case of an existing multilayer structure in which a circuit of a flex circuit section is not joined, reverse bending or deflection may be caused due to the wiring according to a multi-function and high-speed design, and as a result, there is the risk of generation of a short circuit due to damage such as a crack in a signal line or a scratch on an insulator.

According to the present disclosure, the coverlay 231 can significantly reduce the thickness of the rigid circuit section with the cover resin layers 2313, 2315, and 2317 that are bondable on both sides and exist only in the flex circuit section 230, and the internal circuit layers disposed in the flex circuit section 230 can be efficiently protected. Further, in a recent electronic device, in which a universal serial bus (USB) C type, an RF high-frequency wiring, or the like is disposed, such as a smart phone, the circuit section including the coverlay 231 ensures that a physical characteristic that prevents bending once assembled can be achieved, noise can be reduced, and signal integrity and stabilization of RF interference (RFI) can be achieved.

According to various embodiments, the first cover resin layer 2313 and/or the second cover resin layer 2315 may include a thermoplastic resin, an epoxy resin, a filler, and a hardener.

According to various embodiments, before the first cover resin layer 2313 and/or the second cover resin layer 2315 are cured, the thermoplastic resin may impart mutual bonding force such that the compositions of each of the first cover resin layer 2313 and the second cover resin layer 2315 can be formed into a film in a mixed state. In addition, after the first cover resin layer 2313 and/or the second cover resin layer 2315 are cured, the compositions are uniformly dispersed in the first cover resin layer 2313 and/or the second cover resin layer 2315, so that the stresses generated inside the second cover resin layer 2315 under repeated cyclic fatigue conditions applied to the coverlay 231 can be uniformly dispersed and relaxed so as to impart resistance to the generation of cracks.

According to various embodiments, the thermoplastic resin may include at least one of polyisoprene rubber, polybutadiene rubber, 1,2-polybutadiene rubber, styrene-butadiene rubber, acrylonitrile butadiene rubber (NBR), ethylene-butadiene rubber, carboxylated nitrile rubber (XNBR), polyimide resin, and polyamideimide resin, and may preferably include acrylonitrile butadiene rubber (NBR) or polyimide resin.

According to various embodiments, before the first cover resin layer 2313 and/or the second cover resin layer 2315 are cured, since the viscosity of the epoxy resin is rapidly reduced by heating to have flowability, the flowability of the first cover resin layer 2313 and/or the second cover resin layer 2315 can be increased so as to fill an operation formed between the circuits formed on the copper foils 2115 and 2213 in the external and internal circuit layers 211 and 221. As a chemical bonding reaction between the epoxy resin components proceeds after curing, the resin is converted into a strong and firm molecular bonding structure having a net structure, thereby improving the heat resistance and moisture resistance of the finally bonded body, so that heat resistance reliability can be imparted to the coverlay 231.

According to various embodiments, before the first cover resin layer 2313 and/or the second cover resin layer 2315 are cured, the thermoplastic resin may impart mutual bonding force such that the compositions of each of the first cover resin layer 2313 and the second cover resin layer 2315 can be formed into a film in a mixed state. In addition, after the first cover resin layer 2313 and/or the second cover resin layer 2315 are cured, the compositions are uniformly dispersed in the first cover resin layer 2313 and/or the second cover resin layer 2315, so that the stresses generated inside the second cover resin layer 2315 under repeated cyclic fatigue conditions applied to the coverlay can be uniformly dispersed and relaxed so as to impart resistance to the generation of cracks.

According to various embodiments, the thermoplastic resin may include at least one of polyisoprene rubber, polybutadiene rubber, 1,2-polybutadiene rubber, styrene-butadiene rubber, acrylonitrile butadiene rubber (NBR), ethylene-butadiene rubber, carboxylated nitrile rubber (XNBR), polyimide resin, and polyamideimide resin, and may preferably include acrylonitrile butadiene rubber (NBR) or polyimide resin.

According to various embodiments, before the first cover resin layer 2313 and/or the second cover resin layer 2315 are cured, since the viscosity of the epoxy resin is rapidly reduced by heating to have flowability, the flowability of the first cover resin layer 2313 and/or the second cover resin layer 2315 can be increased so as to fill an operation formed between the circuits formed on the copper foils in the flexible circuit board. As a chemical bonding reaction between the epoxy resin components proceeds after curing, the resin is converted into a strong and firm molecular bonding structure having a net structure, thereby improving the heat resistance and moisture resistance of the finally bonded body, so that heat resistance reliability can be imparted to the coverlay.

According to various embodiments, the filler may improve the cost reduction and the elastic modulus of the first cover resin layer 2313 and/or the second cover resin layer 2315. The filler may include at least one of an inorganic filler, such as an aluminum hydroxide, a magnesium hydroxide, or a calcium carbonate, and a phosphine type filler. In an implementation, the filler may include an aluminum hydroxide type filler or a phosphine type filler.

According to various embodiments, the hardener may improve the heat resistance of the first cover resin layer 2313 and/or the second cover resin layer 2315. The hardener may include at least one of an amine type hardener, a phenol type hardener, an acid anhydride type hardener, an imidazole compound, a polyamine compound, a hydrazine compound, and a dicyandiamide compound. In an implementation, the hardener may include at least one of an amine type hardener, a phenol type hardener, and an acid anhydride type hardener.

The laminating order of the 8-6-8 rigid-flex circuit board 200 will be described with reference to FIG. 2 again.

According to various embodiments, the rigid circuit section 210 may include a total of eight layers. In the first layer, the first external circuit layer 211 and the ink layer on the top surface of the first external circuit layer 211 may be disposed. For example, a copper foil 2113 may be laminated on the top surface of a PI-based substrate layer 2211, such as a flexible copper clad laminate (FCCL), and the first external circuit layer 211 may be configured by a copper foil 2115 plated thereon. As still another example, the ink layer may be coated on the top surface of the circuit of the plated copper foil 2115 so as to protect the circuit.

According to various embodiments, the first internal circuit layer 221 may be disposed on the second and third layers of the rigid circuit section 210. The first internal circuit layer 221 may formed by processing the copper foils 2113 disposed on the entire top surface and/or the entire bottom surface of the PI-based substrate layer 2211 by a method, such as exposure or etching. The first internal circuit layer 221 may be disposed over the entire rigid circuit section 210 and the entire flex circuit section 230.

According to various embodiments, a dielectric layer 270, such as a prepreg, may be disposed between the first and second layers of the rigid circuit section 210. The above-described configuration may be repeatedly applied to the multiple layers described below.

According to various embodiments, the second internal circuit layer 223 may be disposed on the fourth and fifth layers of the rigid circuit section 210. The second internal circuit layer 223 may be formed by processing the copper foils 2233 disposed on the entire top surface and/or the entire bottom surface of the PI-based substrate layer 2231 by a method, such as exposure or etching. The second internal circuit layer 223 may be disposed over the entire rigid circuit section 210 and the entire flex circuit section 230.

According to various embodiments, a dielectric layer 270, such as a prepreg, may be disposed between the second and third layers of the rigid circuit section 210.

According to various embodiments, the third internal circuit layer 225 may be disposed on the sixth and seventh layers of the rigid circuit section 210. The third internal circuit layer 225 may formed by processing the copper foils 2253 disposed on the entire top surface and/or the entire bottom surface of the PI-based substrate layer 2251 by a method, such as exposure or etching. The third internal circuit layer 225 may be disposed over the entire rigid circuit section 210 and the entire flex circuit section 230.

According to various embodiments, a dielectric layer 270, such as a prepreg, may be disposed between the fifth and sixth layers of the rigid circuit section 210.

According to various embodiments, in the eighth layer of the rigid circuit section 210, a second external circuit layer 213 and an ink layer may be disposed on the bottom surface of the second external circuit layer 213. For example, a copper foil 2133 may be laminated on the bottom surface of a PI-based substrate layer 2131, such as a flexible copper clad laminate (FCCL), and the second external circuit layer 213 may be configured by a copper foil 2135 plated on the bottom surface of the copper foil 2133. As still another example, the ink layer may be coated on the top surface of the circuit of the plated copper foil 2135 so as to protect the circuit.

According to various embodiments, the flex circuit section 230 may include a total of six layers. The first internal circuit layer 221 corresponding to the second layer and the third layer of the rigid circuit section 210 may be extended to and disposed on the first and second layers of the flex circuit section 230. The external coverlay 232 and the internal coverlay 231 may be respectively formed on the top surface and the bottom surface of the first internal circuit layer 221.

According to various embodiments, in the first external coverlay 232, a cover resin layer 2322 bonded to the top surface of the first internal circuit layer 221 and a coverlay film 2321 bonded to the top surface of the cover resin layer 2322 may be laminated. As another example, a shielding layer 290 may be disposed on the top surface of the coverlay film 2321 to block external electromagnetic waves. As still another example, the first external coverlay 232 may have cover resin layers bonded to both surfaces of one coverlay film 2321.

According to various embodiments, the first internal coverlay 231 may include a first cover resin layer 2313 bonded to the bottom surface of the first internal circuit layer 221, a first coverlay film 2311 bonded to the bottom surface of the first cover resin layer 2313, and a second cover resin layer 2315 bonded to the bottom surface of the first coverlay film 2311.

According to various embodiments, the second internal circuit layer 223 corresponding to the fourth layer and the fifth layer of the rigid circuit section 210 may be extended to and disposed on the third and fourth layers of the flex circuit section 230. The coverlays 231 and 233 may be respectively formed on the top and bottom surfaces of the second internal circuit layer 223. The configurations of the coverlays 231 and 233 may be the same as those disposed in the first internal circuit layer 221.

For example, the first internal coverlay 231 may include a third cover resin layer 2317 bonded to the top surface of the second internal circuit layer 223, a second coverlay film 2311 bonded to top surface of the first cover resin layer 2313, and a second cover resin layer 2315 bonded to the top surface of the second coverlay film 2311.

According to various embodiments, the third internal circuit layer 225 corresponding to the sixth layer and the seventh layer of the rigid circuit section 210 may be extended to and disposed on the fifth and sixth layers of the flex circuit section 230. The coverlays 233 and 234 may be respectively formed on the top and bottom surfaces of the third internal circuit layer 225. The configuration of the internal coverlay 233 disposed on the top surface of the third internal circuit layer 225 may be the same as that disposed on the second internal circuit layer 223. In addition, the configuration of the external coverlay 234 disposed on the bottom surface of the third internal circuit layer 225 may be the same as that disposed on the top surface of the first internal circuit layer 221. As still another example, a shielding layer 290 may be disposed on the bottom surface of the coverlay film 234 to block external electromagnetic waves.

According to various embodiments, an 8-6-8 rigid-flex circuit board 200 includes an internal circuit layer 221 and an external circuit layer 211, and may further include an electronic element (not illustrated). For example, an electronic element may be embedded in the recessed shape within the external circuit layer 211, and may be formed by a punching method using a computer numerical control (CNC) drill or a mold, or a method using a laser drill ($CO_2$ or neodymium-doped yttrium aluminum garnet (YAG)). The electronic element may be a part that is electrically connected to the circuit layer, and may be an active device, such as an IC chip, or a passive device, such as a capacitor or an inductor.

Figure 3:
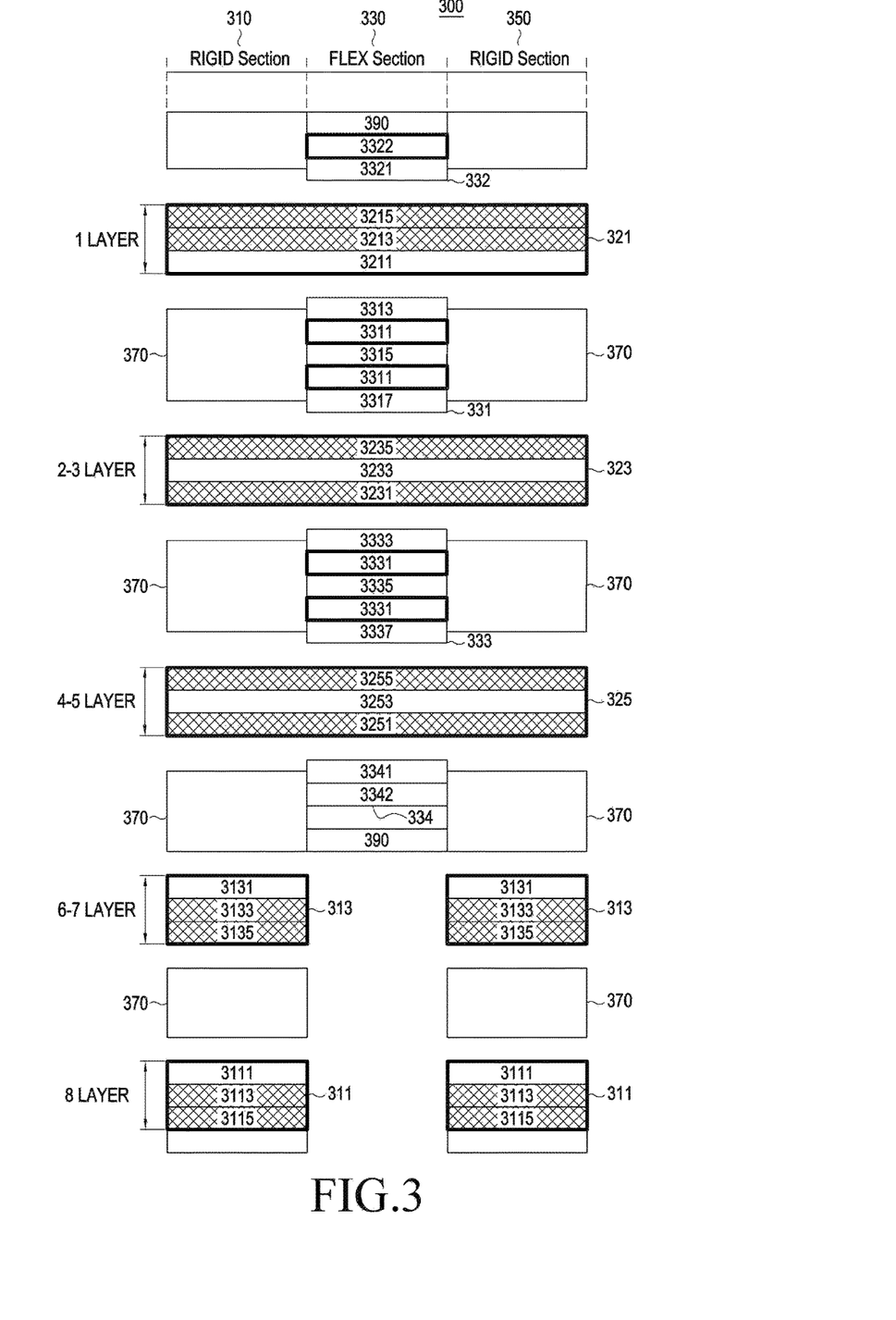
FIG. 3 is a sectional view illustrating a configuration in each layer in a rigid-flex circuit board within an electronic device according to an embodiment of the present disclosure.

FIG. 3 is a sectional view illustrating a configuration in each layer in a rigid-flex circuit board 300 within the electronic device 10 according to an embodiment of the present disclosure.

According to various embodiments, the circuit board 300 illustrated in FIG. 3 may be the printed circuit board 150 of FIG. 1.

Referring to FIG. 3, the rigid-flex circuit board 300 according to the present disclosure will be described based on a type that is configured with an 8-layer rigid circuit portion, a 5-layer flex circuit portion, and an 8-layer rigid circuit portion.

According to various embodiments, the rigid-flex circuit board 300 may be configured as a multilayer structure, and may include a rigid circuit section 310, 350 and a flex circuit section 330 disposed to face at least a portion of the rigid circuit section 310, 350. The rigid circuit section 310, 350 and the flex circuit section 330 may share at least one external circuit layer 321 and internal circuit layer 323, 325.

TABLE 2

| LAYER | SPEC. | THICK (um) | ± | RIGID | FLEX |
|---|---|---|---|---|---|
| 1LAYER | EMI | 16 | | | 16 |
| | PSR | 30 | 5 | 30 | |
| | C/L Film | 12.5 | | | 12.5 |
| | C/L Adhesive | 15 | | | 25 |
| | Cu plating | 18 | 4 | 18 | 18 |
| | Copper | 12 | | 12 | 12 |
| | Polyimide | 12 | | 12 | 12 |
| | P/P | 40 | | 40 | |
| 2LAYER | C/L Adhesive | 10 | | | 10 |
| 3LAYER | C/L Film | 12.5 | | | 12.5 |
| | C/L Adhesive | 15 | | | 10 |
| | Copper | 12 | | 12 | 12 |
| | Polyimide | 12 | | 12 | 12 |
| | Copper | 12 | | 12 | 12 |
| | C/L Adhesive | 10 | | | 10 |
| | C/L Film | 12.5 | | | 12.5 |
| | C/L Adhesive | 10 | | | 10 |
| | P/P | 40 | | 40 | |
| 4LAYER | C/L Film | 12.5 | | | 12.5 |
| 5LAYER | C/L Adhesive | 15 | | | 10 |
| | Copper | 12 | | 12 | 12 |
| | Polyimide | 12 | | 12 | 12 |
| | Copper | 12 | | 12 | 12 |
| | C/L Adhesive | 15 | | | 15 |
| | C/L Film | 12.5 | | | 12.5 |
| | P/P | 40 | | 40 | |
| 6LAYER | C/L Film | 12.5 | | | |
| 7LAYER | C/L Adhesive | 15 | | | |
| | Copper | 12 | | 12 | |
| | Polyimide | 12 | | 12 | |
| | Copper | 12 | | 12 | |
| | C/L Adhesive | 15 | | | |
| | C/L Film | 12.5 | | | |
| | P/P | 40 | | 40 | |
| 8LAYER | Polyimide | 12 | | 12 | |
| | Copper | 12 | | 12 | |
| | Cu plating | 18 | 4 | 18 | |
| | PSR | 30 | 5 | 30 | |
| | C/L Adhesive | 25 | | | |
| | C/L Film | 12.5 | | | |
| | EMI | 16 | | | 16 |
| | Total Thickness (um) | | | 412 | 298.5 |
| | LAYER | | | 8 | 6 |

LAYER: Number of Layers

Table 2 is a table illustrating an 8-5-8 structure (a rigid circuit section of 8 layers and a flex circuit section of 5 layers) of a rigid-flex circuit board 300, and the specification of each layer is represented.

The laminating order of the 8-5-8 rigid-flex circuit board 300 will be described with reference to FIG. 3 and Table 2. According to various embodiments, the rigid circuit section 310 may include a total of eight layers.

According to various embodiments, in the first layer of the rigid-flex circuit board 300, a first external circuit layer 321 and an ink layer 350 may be disposed on the top surface of the first external circuit layer 321. For example, a copper foil 3213 may be laminated on the top surface of a PI-based substrate layer 3211, such as a flexible copper clad laminate (FCCL), and the first external circuit layer 321 may be configured by a copper foil 3215 plated thereon. As still another example, the ink layer 350 may be coated on the top surface of the circuit of the plated copper foil 3215 so as to protect the circuit. The first external circuit layer 321 may be disposed over the entire rigid circuit section 310 and the entire flex circuit section 330.

Hereinafter, the laminated structure of the second to eighth layers of the rigid circuit section 310 (example, external circuit layer 321,323,325,313,311) is the same as that of the embodiment of FIG. 2, and thus only differences in the structure of the flex circuit section 330 will be described.

According to various embodiments, the flex circuit section 330 may include a total of five layers. The first internal circuit layer 321 corresponding to the first layer of the rigid circuit section 310 may be extended to and disposed on the first layer of the flex circuit section 330. The internal coverlay 331 and the external coverlay 332 may be respectively laminated on the top surface and the bottom surface of the first external circuit layer 321 of the flex circuit section 330.

According to various embodiments, the first external coverlay 332, bonded to and disposed on the surface of the plated copper foil 3215 of the first external circuit layer 321, may be formed of a cover resin layer 3321 bonded to the top surface of the first external circuit layer 321 and a coverlay film 3322 bonded to the top surface of the cover resin layer 3321. As still another example, a shielding layer 390 may be disposed on the top surface of the coverlay film 3322 to block external electromagnetic waves. The coverlay film 3322 on the top surface may be formed to have a relatively thick thickness compared with other coverlay films of the present disclosure.

According to various embodiments, the first internal coverlay 331 disposed under the first external circuit layer 321 may have cover resin layers 3313 and 3315, 3317 that are bonded to the opposite surfaces of one coverlay film 3311. For example, the first internal coverlay 331 may include a first cover resin layer 3313 bonded to the bottom surface of the first internal circuit layer 321, a first coverlay film 3311 bonded to the first cover resin layer 3313, and a second cover resin layer 3315 bonded to the bottom surface of the first coverlay film 3311.

According to various embodiments, the first internal circuit layer 323 corresponding to the second layer and the third layer of the rigid circuit section 310 may be extended to and disposed on the second and third layers of the flex circuit section 330. The coverlays 331 and 333 may be formed on the top and bottom surfaces of the first internal circuit layer 323, respectively. The configurations of the coverlays 331 and 333 may be the same as those disposed below the first external circuit layer 321.

According to various embodiments, the second internal circuit layer 325 corresponding to the fourth layer and the fifth layer of the rigid circuit section 310 may be extended to and disposed on the fourth and fifth layers of the flex circuit section 330. The coverlays 333 and 334 may be formed on the top and bottom surfaces of the second internal circuit layer 325, respectively. The configuration of the coverlay 333 disposed on the top surface of the second internal circuit layer 325 may be the same as that disposed on the first internal circuit layer 323. In addition, the configuration of the coverlay 334 disposed on the bottom surface of the second internal circuit layer 325 may be the same as that disposed on the top surface of the first external circuit layer 321. As still another example, a shielding layer 390 may be disposed on the bottom surface of the coverlay 334 (e.g., a coverlay film) to block external electromagnetic waves.

The rigid-flex circuit board 300 is not limited to the structures illustrated in FIGS. 2 and 3, and may be formed in various structures depending on the use of a circuit board included in an electronic device.

Figure 4A:
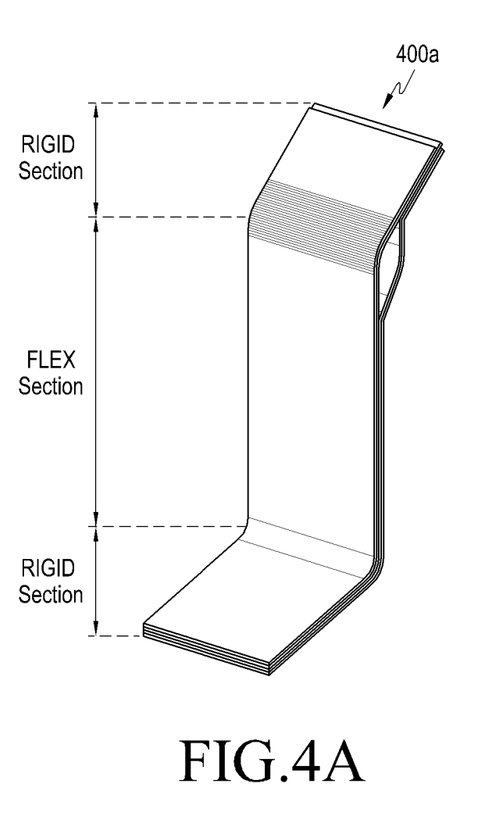
FIGS. 4A and 4B are perspective views illustrating the states of a rigid-flex circuit board in which a resin cover layer is not adhered to either side of a coverlay film and a rigid-flex circuit board in which a resin cover layer is adhered to either side of a coverlay film, according to various embodiments of the present disclosure.
Figure 4B:
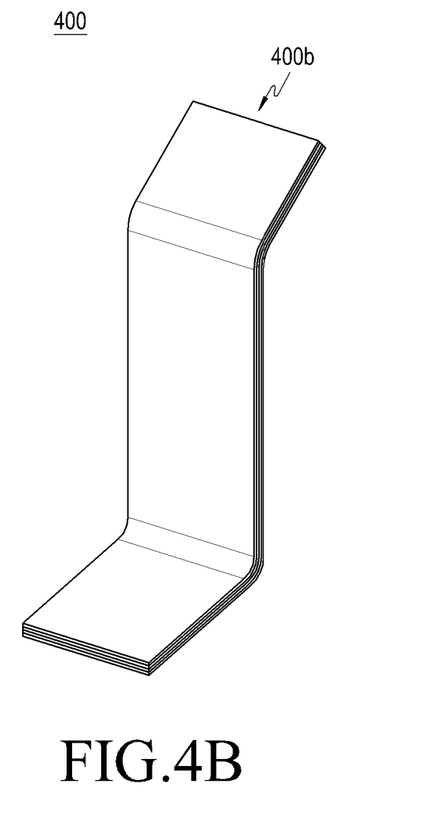

FIGS. 4A and 4B are perspective views illustrating the states of a rigid-flex circuit board 400 in which a resin cover layer is not adhered to either side of a coverlay film and a rigid-flex circuit board in which a resin cover layer is adhered to either side of a coverlay film, according to various embodiments of the present disclosure, respectively.

FIG. 4A illustrates a state of a rigid-flex circuit board 400a when a resin cover layer is bonded only to one surface of a coverlay film, and FIG. 4B illustrates a state of a rigid-flex circuit board 400b when resin cover layers are bonded to both surfaces of the coverlay film, respectively.

According to an embodiment, the flex circuit section of a sub-printed circuit board, disposed at the lower end of the printed circuit board 150 of FIG. 1, will be described as an example. In the flex circuit section of the sub-printed circuit board, an external/internal circuit layer may be disposed, and a coverlay as a dielectric may be applied above or below the circuit layer.

TABLE 3

| LAYER | SPEC. | THICK (um) | ± | RIGID | FLEX |
|---|---|---|---|---|---|
| 1LAYER | EMI | 16 | | | |
| | PSR | 30 | 5 | 30 | |
| | Cu plating | 18 | 4 | 18 | |
| | Copper | 12 | | 12 | |
| | Polyimide | 12 | | 12 | |
| | P/P | 40 | | 40 | |
| 2LAYER | C/L Film | 12.5 | | | 12.5 |
| 3LAYER | C/L Adhesive | 15 | | | 15 |
| | Copper | 12 | | 12 | 12 |
| | Polyimide | 12 | | 12 | 12 |
| | Copper | 12 | | 12 | 12 |
| | C/L Adhesive | 15 | | | 15 |
| | C/L Film | 12.5 | | | 12.5 |

TABLE 3-continued

| LAYER | SPEC. | THICK (um) | ± | RIGID | FLEX |
|---|---|---|---|---|---|
| | P/P | 40 | | 40 | AIR GAP |
| 4LAYER | C/L Film(black) | 12.5 | | | 12.5 |
| 5LAYER | C/L Adhesive | 15 | | | 15 |
| | Copper | 12 | | 12 | 12 |
| | Polyimide | 12 | | 12 | 12 |
| | Copper | 12 | | 12 | 12 |
| | C/L Adhesive | 15 | | | 15 |
| | C/L Film | 12.5 | | | 12.5 |
| | P/P | 40 | | 40 | AIR GAP |
| 6LAYER | C/L Film(black) | 12.5 | | | 12.5 |
| 7LAYER | C/L Adhesive | 15 | | | 15 |
| | Copper | 12 | | 12 | 12 |
| | Polyimide | 12 | | 12 | 12 |
| | Copper | 12 | | 12 | 12 |
| | C/L Adhesive | 15 | | | 15 |
| | C/L Film | 12.5 | | | 12.5 |
| | P/P | 40 | | 40 | |
| 8LAYER | Polyimide | 12 | | 12 | |
| | Copper | 12 | | 12 | |
| | Cu plating | 18 | 4 | 18 | |
| | PSR | 30 | 5 | 30 | |
| | C/L Adhesive | 25 | | | |
| | C/L Film(black) | 12.5 | | | |
| | EMI | 16 | | | 16 |
| | Total Thickness (um) | | | 412 | 305 |
| | LAYER | | | 8 | 6 |

Layer: Number of Layers

Table 3 represents an 8-5-8 structure (a rigid circuit section of 8 layers and a flex circuit section of 5 layers) of a rigid-flex circuit board, and the specification of each layer is represented.

Referring to Table 3 and FIG. 4A, when a resin cover layer is disposed only on one surface of the coverlay film, reverse bending or deflection may occur in a specific layer during assembly (reassembly) due to non-adhesion between multilayer flex circuit sections. Recently, in the case of a circuit layer designed for multi-function and high-speed wiring arranged in an electronic device, poor reliability in performance and high noise may be severely generated due to an inter-layer gap.

Unlike this, referring to FIG. 4B, when resin cover layers are disposed on both surfaces of the coverlay film, reverse bending or deflection does not occur in a specific layer due to strong adhesion between the multilayer flex circuit sections, and due to this, even when a high-speed wiring is provided, noise reduction, signal integrity, and stabilization of radio frequency interference (RFI) can be achieved.

Figure 5A:
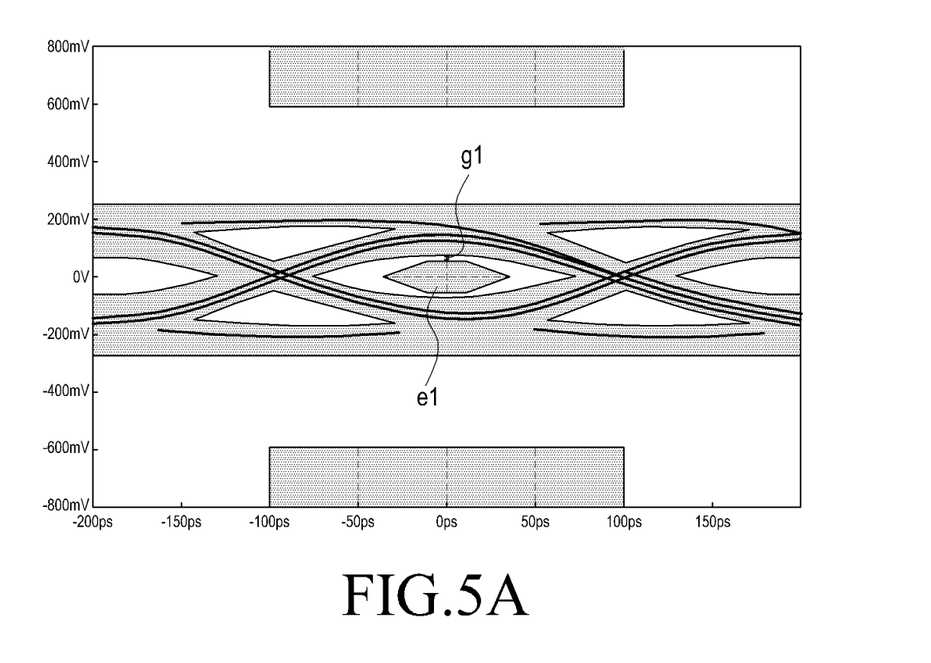
FIGS. 5A and 5B are eye diagrams obtained by using an oscilloscope in which signal measurement values are indicated in connection with the structures in FIGS. 4A and 4B, according to various embodiments of the present disclosure.
Figure 5B:
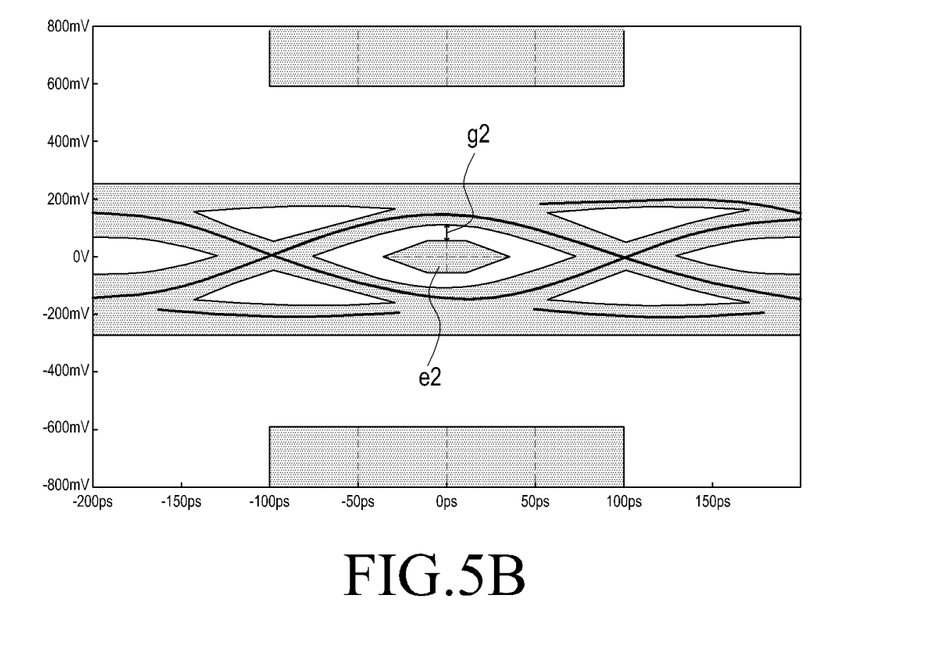

FIGS. 5A and 5B are eye diagrams obtained using an oscilloscope in which signal measurement values are indicated in connection with the structures in FIGS. 4A and 4B, according to various embodiments of the present disclosure.

Referring to FIG. 5, the quality of data signals can be determined based on an eye diagram using an oscilloscope. Based on the eye diagram, a qualitative evaluation on the quality of received data or defects in circuit equipment may be performed with reference to the extent of magnitude of eye opening of an eye pattern. Generally, as the shape of the eye becomes gradually blurred and closed, it may be determined that Inter-Symbol Interference (ISI) becomes very severe and is degraded.

According to an embodiment, with respect to the eye pattern of the eye diagram of FIG. 5A, a relatively larger eye opening may occur in the eye pattern of the eye diagram of FIG. 5B.

Referring to the graphs, it can be seen that the eye e1 on the graph of FIG. 5A and a first gap g1 of an output waveform above the eye are about 139 mV, and the eye e2 on the graph of FIG. 5B and a second gap g2 of an output waveform above the eye is about 170 mV. Accordingly, unlike FIG. 5A, a rigid-flex circuit board (FIG. 5B) according to the present disclosure does not cause a signal distortion, and can have an effect of improving signal quality by about 18% or more.

A multilayer rigid-flex circuit board according to an embodiment may include: at least one rigid circuit section; at least one flex circuit section disposed to face the rigid circuit section; and a plurality of circuit layers disposed to be extended and formed in equal layers within the rigid circuit section and the flex circuit section.

The flex circuit section may include at least one coverlay disposed to face a dielectric layer of the rigid circuit section and formed above or below the circuit layer disposed within the flex circuit section. The coverlay may include a coverlay film, and a first cover resin layer and a second cover resin layer respectively laminated on opposite surfaces of the coverlay films.

According to an embodiment of the present disclosure, the dielectric layer may be formed above or below the circuit layer within the rigid circuit section, and no mutual interference region may be generated between the dielectric layer and the coverlay.

According to an embodiment of the present disclosure, the dielectric layer and the first and second cover resin layers may be disposed to come into contact with each other, and the thickness of each of the first and second cover resin layers may be smaller than the thickness of the dielectric layer.

According to an embodiment of the present disclosure, the first and second cover resin layers may be in a semi-cured state.

According to an embodiment of the present disclosure, the flex circuit section may be disposed between a plurality of rigid circuit sections.

According to an embodiment of the present disclosure, the plurality of circuit layers may include an internal circuit layer and external circuit layers disposed opposite each other with the internal circuit layer interposed therebetween, and the rigid-flex circuit board may further include: a first coverlay having resin cover layers, which are respectively formed on opposite surfaces of a coverlay film, below the first internal circuit layer of the flex circuit section; and a second coverlay having resin cover layers, which are respectively formed on opposite surfaces of a coverlay film, above the second internal circuit layer of the flex circuit section. The first coverlay and the second coverlay may be disposed to face each other and may mutually share one resin cover layer.

According to an embodiment of the present disclosure, a shield layer may be disposed above or below the flex circuit section.

A multilayer rigid-flex circuit board according to an embodiment may include: at least one rigid circuit section including one or more external circuit layers and one or more internal circuit layers disposed between the external circuit layers; and at least one flex circuit section disposed to face the rigid circuit section.

The flex circuit section may include at least one coverlay disposed to face the external circuit layers or the internal circuit layers, and the coverlay may include a coverlay film, and a cover resin layer laminated on at least one surface of the coverlay film.

According to an embodiment of the present disclosure, the coverlay may include external coverlays and an internal coverlay disposed between the external coverlays to face the external coverlays, the external coverlay may include one resin cover layer laminated on one surface of the coverlay film, and the internal coverlay may include resin cover layers laminated on opposite surfaces of the coverlay film.

According to an embodiment of the present disclosure, the plurality of circuit layers disposed in the rigid circuit section may be more than the plurality of circuit layers disposed in the flex circuit section.

According to an embodiment of the present disclosure, the number of external circuit layers and internal circuit layers disposed in the flex circuit section may be equal to the number of coverlay films of the coverlay.

According to an embodiment of the present disclosure, the one or more internal circuit layers may be extended and formed in equal layers within the rigid circuit section and the flex circuit section, and the one or more external circuit layers may be formed only within the rigid circuit section.

According to an embodiment of the present disclosure, the one or more internal circuit layers may include one or more first circuit layers and one or more second internal circuit layers, which are extended and formed in equal layers in the rigid circuit section and the flex circuit section, and a first resin cover layers, a second resin cover layer, and a third resin cover layers may be alternately laminated with the coverlay films between the first internal circuit layers and the second internal circuit layers.

According to an embodiment of the present disclosure, the coverlay film disposed above or below the external circuit layers to face the external circuit layers has a thickness that may be thicker than a thickness of the coverlay film disposed above or below the internal circuit layers to face the internal circuit layers.

According to an embodiment of the present disclosure, a shield layer may be disposed above or below the flex circuit section.

According to an embodiment of the present disclosure, a dielectric layer in the rigid circuit section may be disposed on the same line as the coverlay in the flex circuit section, and no mutual interference region may be generated between the dielectric layer and the coverlay.

According to an embodiment of the present disclosure, the one or more external circuit layers may be extended and formed in equal layers in the rigid circuit section and the flex circuit section.

A multilayer rigid-flex circuit board according to an embodiment may include: a plurality of circuit layers including a rigid circuit section and a flex circuit section; dielectric layers disposed between adjacent circuit layers among the plurality of circuit layers in the rigid circuit section; and a coverlay disposed to face the dielectric layer between the adjacent circuit layers in the flex circuit section. The coverlay may include at least one coverlay film, and a first cover resin layer and a second cover resin layer respectively laminated on opposite surfaces of the coverlay film.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:
1. A multilayer rigid-flex circuit board comprising:
   a plurality of rigid circuit sections;
   at least one flex circuit section disposed between the plurality of rigid circuit sections; and a plurality of circuit layers disposed to be extended within the plurality of rigid circuit sections and the at least one flex circuit section, wherein the at least one flex circuit section includes at least one coverlay disposed to face a dielectric layer of the plurality of rigid circuit sections and formed above or below at least one circuit layer disposed within the at least one flex circuit section, wherein the at least one coverlay comprises:
  a first coverlay film on which cover resin layers are respectively laminated on opposite surfaces, and
  a second coverlay film on which cover resin layers are respectively laminated on opposite surfaces, and
wherein the first coverlay film and the second coverlay film are disposed to face each other and mutually share one cover resin layer.

2. The rigid-flex circuit board of claim 1,
wherein the dielectric layer is formed above or below the at least one circuit layer within the plurality of rigid circuit sections, and
wherein no mutual interference region is generated between the dielectric layer and the at least one coverlay.

3. The rigid-flex circuit board of claim 2,
wherein the dielectric layer and the at least one coverlay is disposed to come into contact with each other, and
wherein a thickness of the at least one coverlay is smaller than a thickness of the dielectric layer.

4. The rigid-flex circuit board of claim 2,
wherein the plurality of circuit layers includes an internal circuit layer and external circuit layers disposed opposite each other with the internal circuit layer being interposed therebetween,
wherein the first coverlay film is disposed below a first internal circuit layer of the at least one flex circuit section, and
wherein the second coverlay film is disposed above a second internal circuit layer of the at least one flex circuit section.

5. The rigid-flex circuit board of claim 2, further comprising:
a shield layer disposed above or below the at least one flex circuit section.

6. A multilayer rigid-flex circuit board comprising:
a plurality of rigid circuit sections including one or more external circuit layers;
one or more internal circuit layers disposed between the one or more external circuit layers; and
at least one flex circuit section disposed between the plurality of rigid circuit sections,
wherein the at least one flex circuit section includes at least one coverlay that protects at least one surface of the one or more external circuit layers or the one or more internal circuit layers,
wherein the at least one coverlay comprises:
  a first coverlay film on which cover resin layers are respectively laminated on opposite surfaces, and
  a second coverlay film on which cover resin layers are respectively laminated on opposite surfaces, and
wherein the first coverlay film and the second coverlay film are disposed to face each other and mutually share one cover resin layer.

7. The rigid-flex circuit board of claim 6,
wherein the at least one coverlay includes external coverlays and an internal coverlay disposed between the external coverlays to face the external coverlays,
wherein the external coverlay includes at least one cover resin layer that is laminated on one surface of a coverlay film, and
wherein the internal coverlay includes a plurality of cover resin layers respectively laminated on opposite surfaces of a coverlay film.

8. The rigid-flex circuit board of claim 6, wherein the plurality of circuit layers disposed in the plurality of rigid circuit sections is more in number than the plurality of circuit layers disposed in the at least one flex circuit section.

9. The rigid-flex circuit board of claim 6, wherein a number of the one or more external circuit layers and the one or more internal circuit layers disposed in the at least one flex circuit section is equal to a number of coverlay films of the at least one coverlay.

10. The rigid-flex circuit board of claim 6,
wherein the one or more internal circuit layers are extended over and formed as same layers in the plurality of rigid circuit sections and the at least one flex circuit section, and
wherein the one or more external circuit layers are formed only in the plurality of rigid circuit sections.

11. The rigid-flex circuit board of claim 6,
wherein the one or more internal circuit layers include one or more first internal circuit layers and one or more second internal circuit layers, which are extended over and formed as same layers in the plurality of rigid circuit sections and the at least one flex circuit section, and
wherein, between the first internal circuit layers and the second internal circuit layers, first resin cover layers, second resin cover layers, and third resin cover layers are alternately laminated with the coverlay films.

12. The rigid-flex circuit board of claim 11, wherein the coverlay film disposed above or below the external circuit layers to face the external circuit layers is thicker than the coverlay film disposed above or below the internal circuit layers to face the internal circuit layers.

13. The rigid-flex circuit board of claim 6, further comprising:
a shield layer disposed above or below the at least one flex circuit section.

14. The rigid-flex circuit board of claim 6, further comprising:
a dielectric layer in the plurality of rigid circuit sections, which is disposed on a same line as the at least one coverlay in the at least one flex circuit section,
wherein, between the dielectric layer and the at least one coverlay, no mutual interference region is generated.

15. The rigid-flex circuit board of claim 14, wherein the one or more external circuit layers are extended over and formed as same layers in the plurality of rigid circuit sections and the at least one flex circuit section.

* * * * *